US006881615B2

(12) United States Patent
Yamazaki et al.

(10) Patent No.: US 6,881,615 B2
(45) Date of Patent: *Apr. 19, 2005

(54) METHOD FOR CRYSTALLIZING SEMICONDUCTOR MATERIAL WITHOUT EXPOSING IT TO AIR

(75) Inventors: Shunpei Yamazaki, Tokyo (JP); Hongyong Zhang, Kanagawa (JP); Naoto Kusumoto, Kanagawa (JP); Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/978,696

(22) Filed: Oct. 18, 2001

(65) Prior Publication Data

US 2002/0025659 A1 Feb. 28, 2002

Related U.S. Application Data

(62) Division of application No. 09/038,926, filed on Mar. 9, 1998, which is a division of application No. 08/396,780, filed on Mar. 1, 1995, now Pat. No. 5,753,542, which is a division of application No. 08/183,800, filed on Jan. 21, 1994, now Pat. No. 5,962,869, which is a continuation-in-part of application No. 07/933,718, filed on Aug. 24, 1992, now Pat. No. 5,296,405, which is a continuation of application No. 07/852,517, filed on Mar. 17, 1992, now abandoned, which is a continuation of application No. 07/520,998, filed on May 9, 1990, now Pat. No. 5,171,710, which is a continuation of application No. 07/251,940, filed on Sep. 28, 1988, now Pat. No. 4,986,213.

(30) Foreign Application Priority Data

Mar. 18, 1991 (JP) .............................. 3-80799

(51) Int. Cl.$^7$ ............................ H01L 21/336
(52) U.S. Cl. ........................ 438/166; 438/96; 438/97; 438/162; 438/487; 438/308
(58) Field of Search ................... 438/166, 96, 97, 438/162, 487, 308

(56) References Cited

U.S. PATENT DOCUMENTS

| 4,068,020 A | 1/1978 | Reuschel |
| 4,151,058 A | 4/1979 | Kaplan et al. |

(Continued)

FOREIGN PATENT DOCUMENTS

| EP | 0 161 555 A2 | 11/1985 |
| EP | 0 178 447 A2 | 4/1986 |

(Continued)

OTHER PUBLICATIONS

Sera et al., "High–Performance TFT's Fabricated by XeCl Excimer Laser Annealing of Hydrogenated Amorphous–Silicon Film", pp. 2868–2872, Dec. 1989, IEEE Transactions on Elecrton Devices, Col. 36, No. 12.

(Continued)

*Primary Examiner*—Long Pham
(74) *Attorney, Agent, or Firm*—Nixon Peabody LLP; Jeffrey L. Costellia

(57) ABSTRACT

A semiconductor material and a method for forming the same, said semiconductor material having produced by a process comprising melting a noncrystal semiconductor film containing therein carbon, nitrogen, and oxygen each at a concentration of $5\times10^{19}$ atoms·cm$^{-3}$ or lower, preferably $1\times10^{19}$ atoms·cm$^{-3}$ or lower, by irradiating a laser beam or a high intensity light equivalent to a laser beam to said noncrystal semiconductor film, and then recrystallizing the thus molten amorphous silicon film. The present invention provides thin film semiconductors having high mobility at an excellent reproducibility, said semiconductor materials being useful for fabricating thin film semiconductor devices such as thin film transistors improved in device characteristics.

18 Claims, 6 Drawing Sheets

U.S. PATENT DOCUMENTS

| | | | |
|---|---|---|---|
| 4,226,898 A | 10/1980 | Ovshinsky et al. | |
| 4,266,986 A | 5/1981 | Benton et al. | |
| 4,313,783 A | 2/1982 | Davies et al. | |
| 4,322,253 A | 3/1982 | Pankove et al. | |
| 4,330,363 A | 5/1982 | Biegesen et al. | |
| 4,335,161 A | 6/1982 | Luo | |
| 4,343,081 A | 8/1982 | Morin et al. | |
| 4,365,013 A | 12/1982 | Ishioka et al. | |
| 4,371,738 A | 2/1983 | Staebler | |
| 4,378,417 A | 3/1983 | Maruyama et al. | |
| 4,398,343 A | 8/1983 | Yamazaki | |
| 4,402,762 A | 9/1983 | John et al. | |
| 4,405,435 A | 9/1983 | Tateishi | |
| 4,469,527 A | 9/1984 | Sugano et al. | |
| 4,482,395 A | 11/1984 | Hiramoto | |
| 4,498,416 A | 2/1985 | Bouchaib | |
| 4,498,951 A * | 2/1985 | Tamura et al. | 117/43 |
| 4,503,807 A | 3/1985 | Nakayama et al. | |
| 4,523,370 A | 6/1985 | Sullivan et al. | |
| 4,552,595 A | 11/1985 | Hoga | |
| 4,557,036 A | 12/1985 | Kyuragi et al. | |
| 4,567,061 A | 1/1986 | Hayashi et al. | |
| 4,569,697 A | 2/1986 | Tsu et al. | |
| 4,575,466 A | 3/1986 | Iwai et al. | |
| 4,576,851 A | 3/1986 | Iwamatsu | |
| 4,582,720 A | 4/1986 | Yamazaki | |
| 4,589,951 A | 5/1986 | Kawamura | |
| 4,590,091 A | 5/1986 | Rogers, Jr. et al. | |
| 4,591,892 A | 5/1986 | Yamazaki | |
| 4,592,306 A | 6/1986 | Gallego | |
| 4,592,799 A | 6/1986 | Hayafuji | |
| 4,595,601 A | 6/1986 | Horioka et al. | |
| 4,596,604 A * | 6/1986 | Akiyama et al. | 438/152 |
| 4,597,160 A | 7/1986 | Ipri | |
| 4,599,133 A | 7/1986 | Miyao et al. | |
| 4,609,407 A * | 9/1986 | Masao et al. | 438/155 |
| 4,624,737 A | 11/1986 | Shimbo | |
| 4,640,223 A | 2/1987 | Dozier | |
| 4,663,829 A | 5/1987 | Hartman et al. | |
| 4,694,143 A | 9/1987 | Nishimura | |
| 4,698,486 A | 10/1987 | Sheets | |
| 4,699,863 A | 10/1987 | Sawatari et al. | |
| 4,714,684 A | 12/1987 | Sugahara et al. | |
| 4,719,123 A | 1/1988 | Haku et al. | |
| 4,727,044 A | 2/1988 | Yamazaki | |
| 4,740,829 A | 4/1988 | Nakagiri et al. | |
| 4,755,865 A | 7/1988 | Wilson et al. | |
| 4,766,477 A | 8/1988 | Nakagawa et al. | |
| 4,772,927 A | 9/1988 | Saito et al. | |
| 4,800,174 A | 1/1989 | Ishihara et al. | |
| 4,803,528 A | 2/1989 | Pankove | |
| 4,808,554 A | 2/1989 | Yamazaki | |
| 4,814,292 A | 3/1989 | Sasaki et al. | |
| 4,843,022 A | 6/1989 | Yamazaki | |
| 4,860,069 A | 8/1989 | Yamazaki | |
| 4,862,237 A | 8/1989 | Morozumi | |
| 4,888,305 A | 12/1989 | Yamazaki et al. | |
| 4,891,330 A | 1/1990 | Guha et al. | |
| 4,897,360 A | 1/1990 | Guckel et al. | |
| 4,937,205 A | 6/1990 | Nakayama et al. | |
| 4,949,700 A | 8/1990 | Ebashi | |
| 4,959,700 A | 9/1990 | Yamazaki | |
| 4,963,503 A | 10/1990 | Aoki et al. | |
| 4,969,025 A | 11/1990 | Yamamoto et al. | |
| 4,969,031 A | 11/1990 | Kobayashi et al. | |
| 4,975,387 A | 12/1990 | Prokes et al. | |
| 4,986,213 A * | 1/1991 | Yamazaki et al. | 118/719 |
| 5,009,689 A | 4/1991 | Haisma et al. | |
| 5,036,373 A | 7/1991 | Yamazaki | |
| 5,077,223 A | 12/1991 | Yamazaki | |
| 5,091,334 A | 2/1992 | Yamazaki et al. | |
| 5,108,843 A | 4/1992 | Ohtaka et al. | |
| 5,112,764 A | 5/1992 | Mitra et al. | |
| 5,120,667 A | 6/1992 | Tarui et al. | |
| 5,132,754 A | 7/1992 | Serikawa et al. | |
| 5,132,821 A | 7/1992 | Nicholas | |
| 5,141,058 A | 8/1992 | Heppner | |
| 5,145,808 A | 9/1992 | Sameshima et al. | |
| 5,171,710 A * | 12/1992 | Yamazaki et al. | 438/477 |
| 5,174,881 A | 12/1992 | Iwasaki et al. | |
| 5,186,718 A | 2/1993 | Tepman et al. | |
| 5,194,398 A | 3/1993 | Miyachi et al. | |
| 5,200,017 A | 4/1993 | Kawasaki et al. | |
| 5,210,050 A | 5/1993 | Yamazaki et al. | |
| 5,248,630 A | 9/1993 | Serikawa et al. | |
| 5,250,818 A | 10/1993 | Saraswat et al. | |
| 5,262,654 A | 11/1993 | Yamazaki | |
| 5,264,383 A | 11/1993 | Young | |
| 5,266,116 A | 11/1993 | Fujioka et al. | |
| 5,272,361 A | 12/1993 | Yamazaki | |
| 5,278,093 A | 1/1994 | Yonehara | |
| 5,288,658 A | 2/1994 | Ishihara | |
| 5,292,675 A | 3/1994 | Codama | |
| 5,296,405 A * | 3/1994 | Yamazaki et al. | 438/487 |
| 5,306,651 A | 4/1994 | Masumo et al. | |
| 5,310,410 A | 5/1994 | Begin et al. | |
| 5,313,075 A | 5/1994 | Zhang et al. | |
| 5,313,076 A | 5/1994 | Yamazaki et al. | |
| 5,314,538 A | 5/1994 | Maeda et al. | |
| 5,314,839 A | 5/1994 | Mizutani et al. | |
| 5,324,360 A | 6/1994 | Kozuka | |
| 5,338,388 A | 8/1994 | Sugahara et al. | |
| 5,352,291 A | 10/1994 | Zhang et al. | |
| 5,543,636 A | 8/1996 | Yamazaki | |
| 5,643,826 A | 7/1997 | Ohtani et al. | |
| 5,744,818 A | 4/1998 | Yamazaki et al. | |
| 5,753,542 A * | 5/1998 | Yamazaki et al. | 438/162 |
| 5,962,869 A * | 10/1999 | Yamazaki et al. | 257/49 |
| 6,392,810 B1 * | 5/2002 | Tanaka | 359/622 |
| 6,423,586 B1 * | 7/2002 | Yamazaki et al. | 438/166 |
| 6,468,842 B1 * | 10/2002 | Yamazaki et al. | 438/151 |

FOREIGN PATENT DOCUMENTS

| | | |
|---|---|---|
| EP | 0 211 634 | 2/1987 |
| GB | 2 065 973 A | 7/1981 |
| JP | 53-027483 | 3/1978 |
| JP | 56-023784 | 3/1981 |
| JP | 56-137641 | 10/1981 |
| JP | 56-137642 | 10/1981 |
| JP | 57-010267 | 1/1982 |
| JP | 57-045921 | 3/1982 |
| JP | 57-094482 | 6/1982 |
| JP | 57-115856 | 7/1982 |
| JP | 58-015943 | 3/1983 |
| JP | 58-093223 | 6/1983 |
| JP | 58-112324 | 7/1983 |
| JP | 58-201326 | 11/1983 |
| JP | 58-212178 | 12/1983 |
| JP | 60-042817 | 3/1985 |
| JP | 60-072226 | 4/1985 |
| JP | 0 139 409 | 5/1985 |
| JP | 60-110164 | 6/1985 |
| JP | 60-245124 | 12/1985 |
| JP | 60-245173 | 12/1985 |
| JP | 61-058278 | 3/1986 |
| JP | 61-078119 | 4/1986 |
| JP | 61-078120 | 4/1986 |
| JP | 61-131413 | 6/1986 |
| JP | 62-016509 | 1/1987 |
| JP | 62-031111 | 2/1987 |
| JP | 62-104117 | 5/1987 |

| | | |
|---|---|---|
| JP | 63-025913 | 2/1988 |
| JP | 63-054773 | 3/1988 |
| JP | 63-060519 | 3/1988 |
| JP | 63-136510 | 6/1988 |
| JP | 63-288010 | 11/1988 |
| JP | 63-300509 | 12/1988 |
| JP | 64-025515 | 1/1989 |
| JP | 01-184928 | 7/1989 |
| JP | 01-187814 | 7/1989 |
| JP | 01-212431 | 8/1989 |
| JP | 01-241862 | 9/1989 |
| JP | 01-286463 | 11/1989 |
| JP | 02-028315 | 1/1990 |
| JP | 02-103925 | 4/1990 |
| JP | 02-148831 | 6/1990 |
| JP | 02-170522 | 7/1990 |
| JP | 2-239615 | 9/1990 |
| JP | 02-271611 | 11/1990 |
| JP | 03-088323 | 4/1991 |
| JP | 03-220529 | 9/1991 |

OTHER PUBLICATIONS

Sun et al., "Growth Temperature Dependence of uc–Si:H Films Sputtered with Hydrogen Gas", pp. L1019–L1032, Jul. 1990, Japanese Journal of Applied Physics, vol. 29, No. 7.

Tanouchi et al., "Characterization of uc–Si:H Films Prepared by H2 Sputtering", pp. L385–L387, Mar. 1990, Japanese Journal of Applied Physics, vol. 29, No. 3.

Palma et al., "Laser–Induced Crystallization of a Si Studied Raman Microspectroscopy", pp. 24–28, 1999, Appl. Surface Sci.

Gat et al., "Annealing of Ion Implanted Si . . . ", pp. 195, 1980, Radiation Effects 48 (1–4).

Sameshima et al., "XeCI Excimer Laser Annealing Used to Fabricate Poly–Si TFT's", pp. 1789–1793, Oct. 1989, Japanese J. of Appl Phys. vol. 28, No. 10.

Sameshima et al., "XeCI Excimer Laser Annealing Used to Fabricate Poly–Si TFT's", pp. 435–440, 1986, Mat. Res. Soc. Symp. Proc. vol. 71.

Pummer, "Commercial Excimer Laser", pp. 38–42, Scientific and Engineering Applications of Commercial Laser Devices, vol.. 610.

Pressley, "Excimer Laser Processing Semiconductors, Excimer Lasers Provide New Capabilities for Semiconductor Processors", pp. 93–98, May 1985, Lasers & Applications.

Kiang et al., "Modification of Semiconductor Device Characteristics by Lasers", pp. 171–176, 1982, IBM.

Masumo et al., "Low Temperature Fabrication of Poly–Si TFT by Laser Induced Crystallization of a Si", pp. 147–149, 1989, J. of Non–Crystalline Solids 115.

Yuki et al., "A Full–Color LCD Addressed by Poly–Si TFT's Fabricated Below 450 C", pp. 1934–1937, Sep. 1989, IEEE Transactions on Electron Devices, vol. 36, No. 9.

Iwamatsu et al., "Silicon–on–Sapphire M.O.S.F.E.T.S Fabricated by Back–Surface Laser Anneal Technology", pp. 827–828, Dec. 6, 1979, Electronics Letters, vol. 15, No. 25.

Lemmons et al., "Microscopy of Si Films During Laser Melting", pp. 703–706, Apr. 15, 1982, Appl. Phys. Lett., vol. 40, No. 8.

Prussin et al., "Laser Annealing of Low–fluence Ion–implanted Silicon", pp. 3853–3859, Jul. 1980, J. Appl. Phys. vol. 51, No. 7.

Kennedy et al., "Influence of O, C, N and Noble Gases on the Crystallization of Amorphous Si Layers", pp. 4241–4246, Oct. 1977, J. Appl. Phys. vol. 48, No. 10.

Kamins et al., "Oxygen Concentration in LPCVD Polysilicon Films", pp. 80–82, Apr. 1990, Solid State Technology, vol. 33.

Klimenko et al., "Use of Argon Laser Radiation in Restoration of Single–Crystal State of Ion–Implantation–Amorphized Silicon Surface", pp. 1289–1291, 1976, Sov. J. Quant. Electro., vol. 5, No. 10.

Wouters et al., "Effects of capping Layer . . . in Laser Recrystallized Si Films", ., 1989, J. Appl. Phys. 66(2).

Wolf et al., "Silicon Processing for the VLSI Era", pp. 19–21, ., Lattice Press, Sunset Beach CA.

Gat et al., "Annealing of Ion Implanted Si . . . ", ., 1980, Radiation Effects 48(1–4), 195.

Kuwano et al., "Photovoltaic Behavior of Amorphous Si:H and Si:F:H Solar Cells", pp. 698–703, Published Aug. 1981, Conference Record, 15th IEEE Photovoltaic Specialists Conf., Kissimmee, Florida, USA.

Chik et al., "Photoconductivity of evaporated amorphous silicon films post–hydrogenated in a theta–pinch plasma", pp. 3562–3570, Mar. 15, 1983, Physical Review B, vol. 27, No. 6.

Pizzini et al., "Effect of Oxygen and Carbon Segregation on the Electrical Properties of Grain Boundaries in Silicon", pp. 353–358, 1989, Mat. Sci. and Eng., B4, No. 1–4 FULL TRANSLATION.

Flat Panel Display 1991 (pp. 156–159).

SOI Structure Formation Technology (1987) pp. 35–37.

* cited by examiner

METHOD FOR CRYSTALLIZING SEMICONDUCTOR MATERIAL WITHOUT EXPOSING IT TO AIR

BACKGROUND OF THE INVENTION

1. Field of the Invention

The present invention relates to a semiconductor material, e.g., containing silicon as the major component. More particularly, the present invention relates to a thin film transistor improved in properties and a process for fabricating the same. The semiconductor material according to the present invention enables fabrication of thin film semiconductor devices such as thin film transistors having excellent device characteristics.

2. Description of the Prior Art

Non-crystalline semiconductor materials (the so-called amorphous semiconductors) and polycrystalline semiconductor materials have been heretofore used for the fabrication of thin film semiconductor devices such as thin film field effect transistors and the like. The term "amorphous materials" as referred herein signifies not only the materials having a strict structural disordering in the atomic level, but also includes those having a short range ordering for a distance of about several nanometers. More concretely, "amorphous materials" include silicon materials having an electron mobility of 10 $cm^2/V \cdot s$ or lower and materials having a carrier mobility lowered to 1% or less of the intrinsic carrier mobility of the corresponding semiconductor material. Accordingly, materials consisting of fine crystal aggregates which are composed of fine crystals about 10 nm in size, i.e., the materials known as microcrystals (having a grain diameter of 50 to 500 Å as calculated according to shira equation in Raman shift) or semi-amorphous materials (having lattice distortion therein and a peak in Raman shift at less than 521 $cm^{-1}$, and having a structure comprising amorphous structure and crystalline structure with undefined boundary), are collectively referred to hereinafter as amorphous materials.

The use of an amorphous semiconductor such as amorphous silicon (a-Si) and amorphous germanium (a-Ge) in the fabrication of a semiconductor device is advantageous in that the process can be conducted at a relatively low temperature of 400° C. or even lower. Thus, much attention is paid now to a process using an amorphous material, because such a process is regarded as a promising one for the fabrication of liquid crystal displays and the like, to which a high temperature process cannot be applied.

However, a pure amorphous semiconductor has an extremely low carrier mobility (electron mobility and hole mobility). Thus, pure amorphous semiconductors are rarely applied as they are, for example, to channel-forming areas of thin film transistors (TFTs); in general, the pure amorphous semiconductor materials are subjected to the irradiation of a high energy beam such as a laser beam or a light emitted from a Xenon lamp, so that they may be once molten to recrystallize and thereby modified into a crystalline semiconductor material having an improved carrier mobility. Such a treatment of high energy beam irradiation is referred hereinafter collectively as "laser annealing". It should be noted, however, that the high energy beam not necessary be a laser beam, and included in the high intensity beam is, for example, a powerful light emitted from a flash lamp which has a similar effect on the semiconductor material as the laser beam irradiation.

Generally, however, the semiconductor materials heretofore obtained by laser annealing are still low in the carrier mobility as compared with those of single crystal semiconductor materials. In the case of a silicon film, for example, the highest reported electron mobility is 200 $cm^2/V \cdot s$ at best, which is a mere one seventh of the electron mobility of a single silicon, 1350 $cm^2/V \cdot s$. Moreover, the semiconductor characteristics (mainly mobility) of the semiconductor material thus obtained by the laser annealing process suffers poor reproducibility and also scattering of the mobility values over the single film. Those disadvantages lead to a low product yield of semiconductor devices having a plurality of elements fabricated on a single plane.

SUMMARY OF THE INVENTION

An object of the present invention is to provide a thin film semiconductor material having a high mobility and a process for forming the same with excellent reproducibility. More specifically, an object of the present invention is to provide a process in which the problems of the conventional laser annealing process are overcome, and to provide, accordingly, a practically feasible thin film semiconductor material improved in characteristics.

DETAILED DESCRIPTION OF THE INVENTION

Raman spectroscopy is an effective method for evaluating the crystallinity of a material, and it has been used with the purpose of quantitatively evaluating the crystallinity of a semiconductor film fabricated by a laser annealing process. During an extensive study on the laser annealing process conducted by the present inventors, it has been found that the center wavenumber, as well as the width, the height, etc., of the Raman peak of a laser-annealed semiconductor film is closely related to the properties of the semiconductor film.

For instance, the Raman peak at 521 cm$^{-1}$ for a single crystal silicon was observed on a laser-annealed silicon film to be shifted to a shorter wavenumber (longer wavelength). It has been also found that the center wavenumber of this Raman peak is strongly correlated with the carrier mobility of the silicon film obtained by laser annealing.

Figure 1:
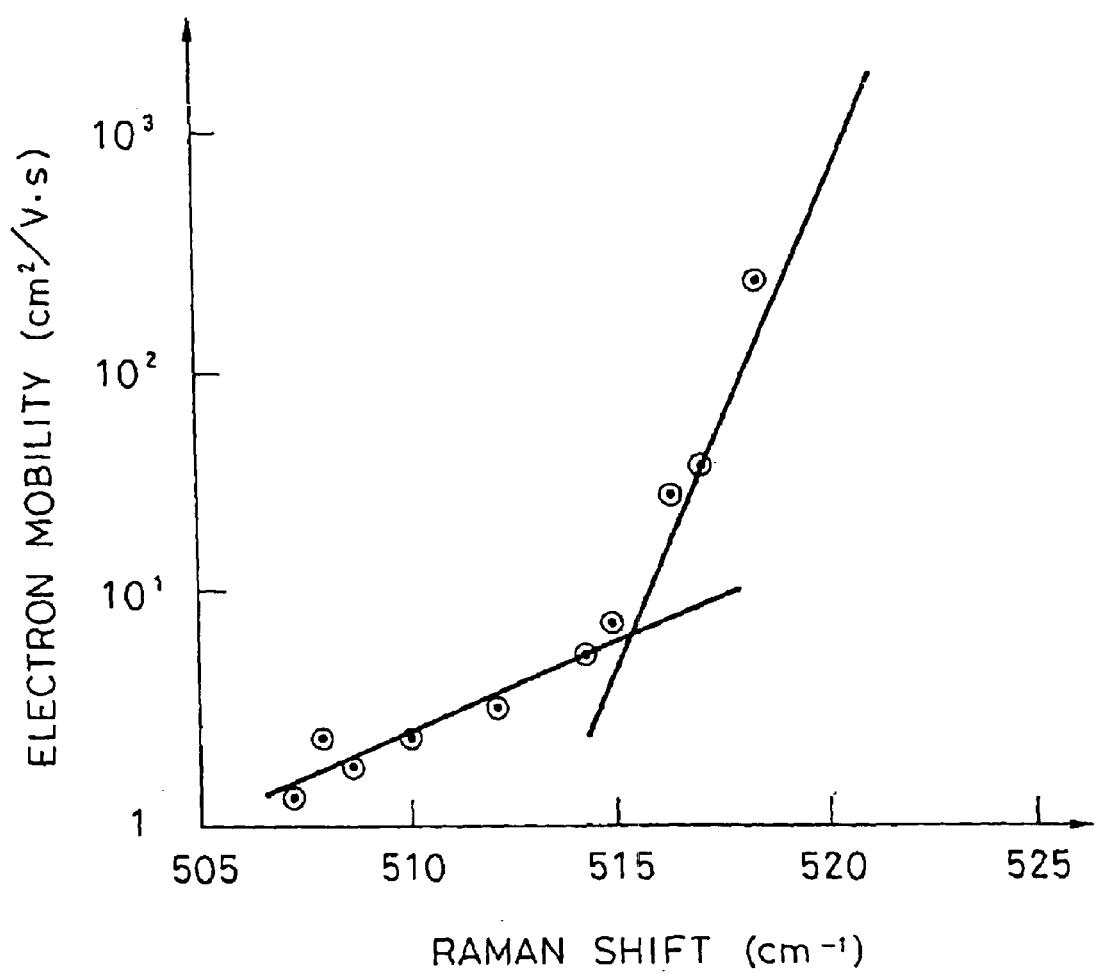
FIG. 1 is a graph showing the relation between the center wavenumber of the Raman peak (Raman shift; taken in the abscissa) and the electron mobility (the ordinate) of a laser-annealed silicon film. The oxygen concentration of the film is found to be $2 \times 10^{21}$ $cm^{-3}$.

Referring to FIG. 1, an example which illustrates the relation above is explained. FIG. 1 relates the center wavenumber of the Raman peak (abscissa) to the electron mobility (ordinate) of a laser-annealed silicon film. The electron mobility was obtained by measuring the capacitance-voltage (C-V) characteristics on a TFT having fabricated from the silicon film. From FIG. 1, it can be read that the electron mobilities for those having a Raman peak center of 515 cm$^{-1}$ or higher behave quite differently from the mobilities of those having a Raman peak center below 515 cm$^{-1}$. More specifically, it can be seen that the Raman peak center is more sensitive to the change in electron mobility in the peak center wavenumber region of 515 cm$^{-1}$ or shorter; beyond this wavenumber, in contrast, a little shift of Raman peak to higher wavenumber side signifies a large increase in electron mobility.

This phenomena is clearly an evidence of the presence of two phases. According to the study of the present inventors, the phase observed with a Raman peak at 515 cm$^{-1}$ or lower is assumed as a phase which has achieved atomic ordering in the solid phase without undergoing melting, whereas the phase having a Raman peak of 515 cm$^{-1}$ or higher is assumably a phase having solidified from a liquid phase which has once experienced melting by laser annealing.

The center wavenumber of the Raman peak was 521 cm$^{-1}$ at maximum, and the highest observed electron mobility was about 200 cm$^2$/V·s.

In the course of the study for improving the mobility, the present inventors then found that oxygen, nitrogen, and carbon atoms incorporated in the film greatly influence the mobility. In the laser-annealed silicon films investigated and which yielded the results shown in FIG. 1, the nitrogen and oxygen atoms were both incorporated in negligible amounts, however, the number of oxygen atoms present at the central portion of the film was about 2×10$^{21}$ atoms·cm$^{-3}$. Then, the number of oxygen atoms in the film was decreased to see the influence of this decrease on the relation between the Raman peak center and the electron mobility.

The concentration of elements other than silicon, such as oxygen, nitrogen, and carbon, is referred hereinafter to the concentration of those elements at the central portion of the film. The concentration of the elements in the central region is taken into account because despite the extremely high concentration of those elements in the portion near the substrate or at the vicinity of the surface, the impurity elements in those portions are believed to have little influence in the carrier mobility which is to be considered in the present invention. In general, within a coating, the portion low in concentration of those foreign elements exists at the central portion of the film, and it is believed that the central portion of the film plays an important role in a semiconductor device such as a field effect transistor. Accordingly, "a concentration of a foreign element" referred simply herein signifies the concentration at the central portion of the film.

Figure 2:
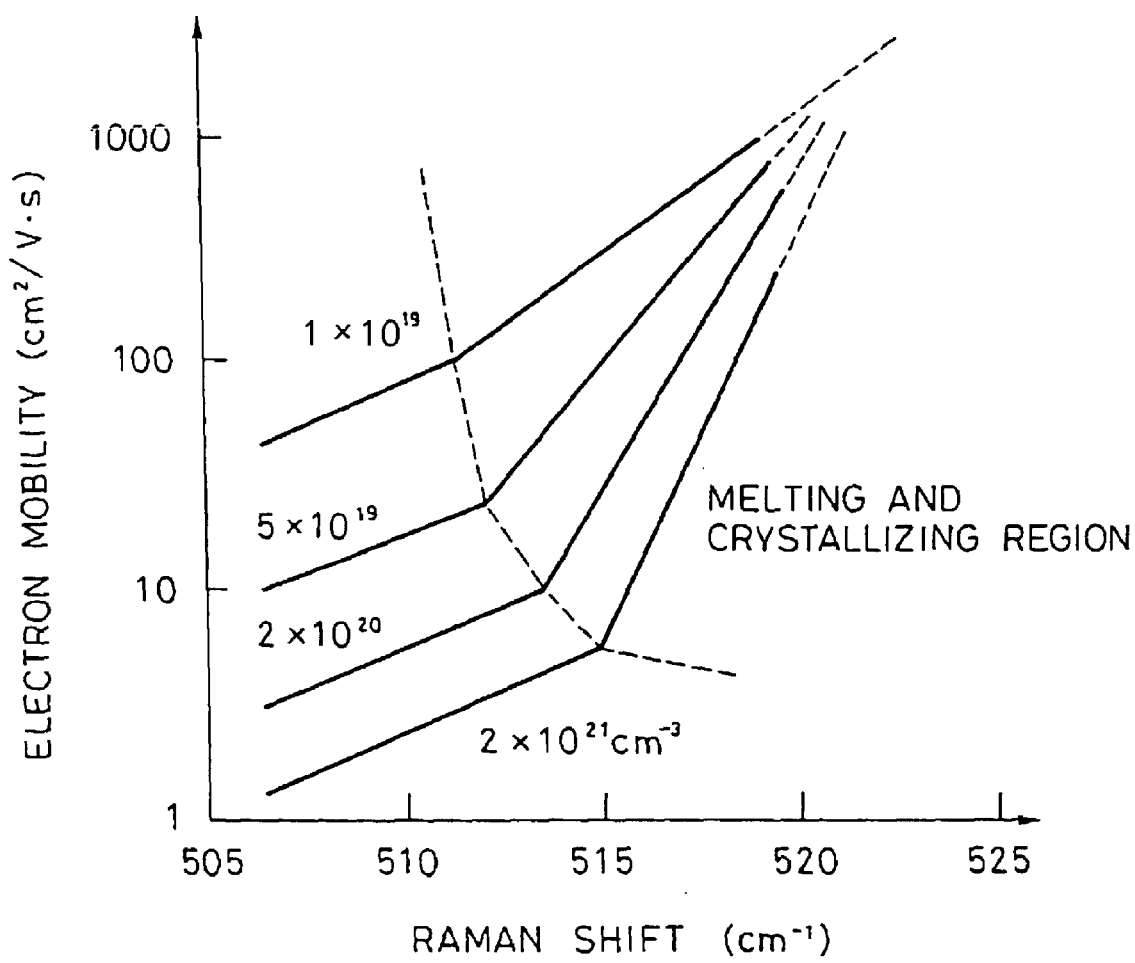
FIG. 2 is a graph showing the relation between the center wavenumber of the Raman peak (Raman shift; taken in the abscissa) and the electron mobility (the ordinate) of laser-annealed silicon films with varying oxygen concentration.

The influence of oxygen concentration on the relation between the electron mobility and the Raman peak center is illustrated in FIG. 2. Obviously, the electron mobility is significantly improved by reducing the oxygen concentration of the film. The same tendency was observed for both carbon and nitrogen. As a possible explanation for the results obtained above, the present inventors propose two mechanisms as follows. In the case of laser annealing a film containing oxygen at a high concentration, the portions low in oxygen atoms serve as crystal nuclei to effect crystal growth during the melting and crystallization of the film; the oxygen atoms incorporated into the film are driven to the periphery with the growth of the crystal, and are precipitated at the grain boundaries. Thus, the film as a whole which results from such a process is lowered in mobility due to the barriers created at the grain boundaries. Another possible explanation the present inventors propose is that the oxygen atoms or the areas rich in oxygen (in general, those areas are believed to have a higher melting temperature) function as crystal nuclei to effect crystal growth. Accordingly, the size of the individual crystals becomes smaller with increasing population of the oxygen atoms. This leads to a lower crystallinity because of the crystals having grown into smaller size, which in consequence give a lower mobility.

At any rate, decreasing the oxygen concentration in the film is effective for significantly increasing the electron mobility thereof by laser annealing. For example, an electron mobility as high as 1000 cm$^2$/V·s was obtained by controlling the oxygen concentration to 1×10$^{19}$ atoms·cm$^{-3}$. Similar results were obtained by lowering the concentrations of nitrogen and carbon atoms as well. Also, a similar tendency was observed on hole mobilities.

Furthermore, as in the case of FIG. 1, the curve relating the electron mobility to the Raman peak position shows typically a knickpoint (i.e., a bent) irrespective of the oxygen concentration. Referring to FIG. 2, the present inventors denoted the region at the right side (the side higher in wavenumber) of the broken lines as a melting and crystallizing region. This is because a film falling in this region is surmised that it has undergone melting and recrystallization upon laser annealing. A high mobility was obtained on films falling in this region. The semiconductor material in accordance with the present invention preferably has a Raman shift of 512 cm$^{-1}$ or more and is preferably produced by laser annealing a semiconductor containing therein oxygen, nitrogen and carbon at a concentration of 5×10$^{19}$ atoms·cm$^{-3}$ or less respectively in the melting and crystallizing region.

Figure 3:
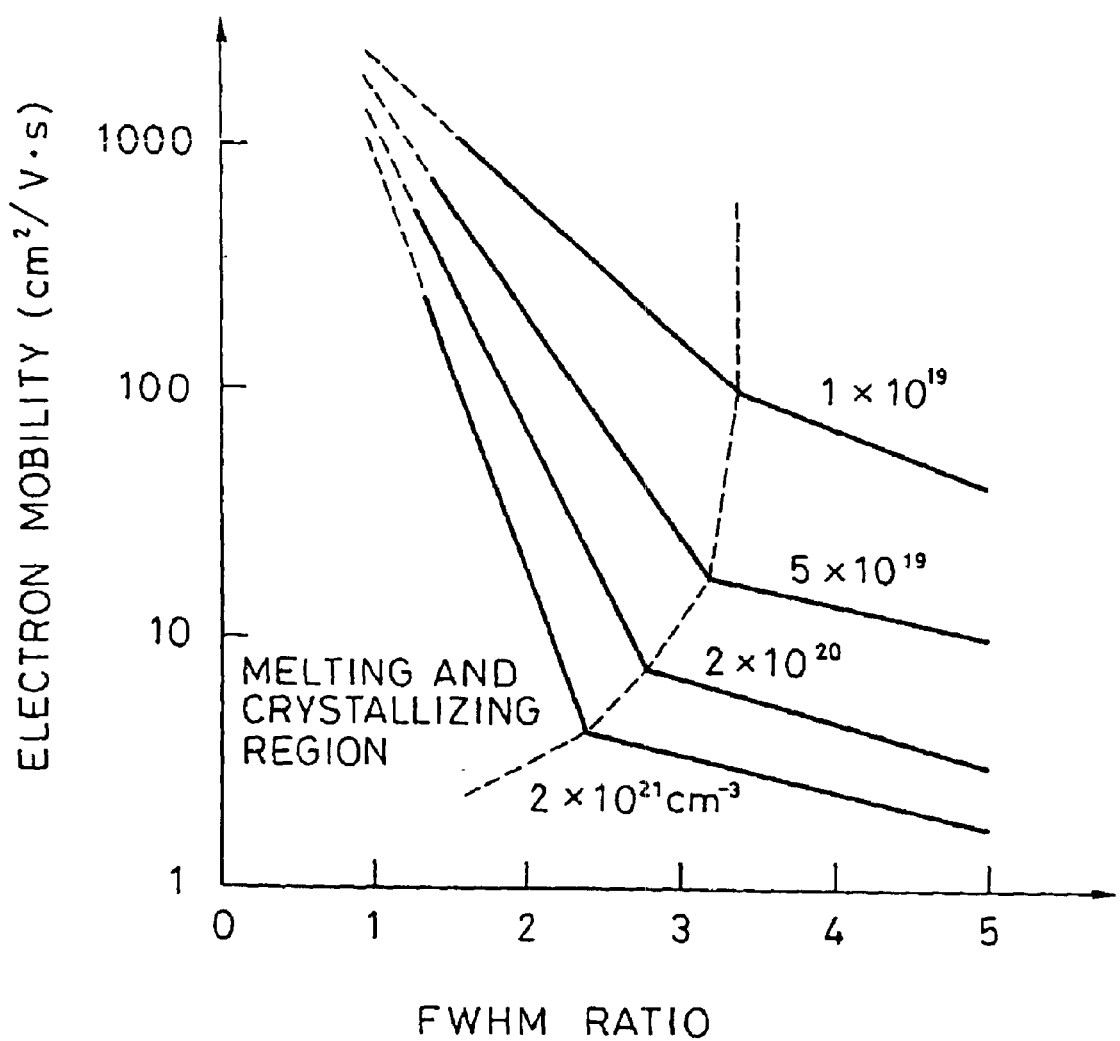
FIG. 3 is a graph showing the relation between the ratio of the full band width at half maximum (FWHM) of the Raman peak for a laser-annealed silicon film to the FWHM of the Raman peak for a single crystal silicon (FWHM ratio; taken in the abscissa) and the electron mobility (the ordinate), for laser-annealed silicon films with varying oxygen concentration.

Another similar tendency was observed by the present inventors on the relation between the full band width at half maximum (FWHM) and the electron mobility. The relation is shown in FIG. 3. The abscissa is the full band width at half maximum ratio (FWHM ratio), which is defined herein as a ratio of the FWHM of a Raman peak obtained on a laser-annealed film to that obtained on a single crystal silicon. A smaller FWHM ratio closer to unity represents a film having a structure similar to that of a single crystal silicon. Referring to FIG. 3, it can be seen that the FWHM ratio becomes closer to 1 with increasing electron mobility if films of equal oxygen concentration are compared. Also, as was the case above in the relation between the mobility and the Raman peak center, the electron mobility increased with lowering the oxygen concentration in the film; similar results were again obtained for nitrogen and carbon atoms. That is, a higher electron mobility was obtained with decreasing concentration of foreign atoms. Similarly, the same tendency was observed for hole mobilities. In FIG. 3, the region at the left hand side of the broken lines shown in the FIGURE is again considered as the melting and crystallizing region.

Figure 4:
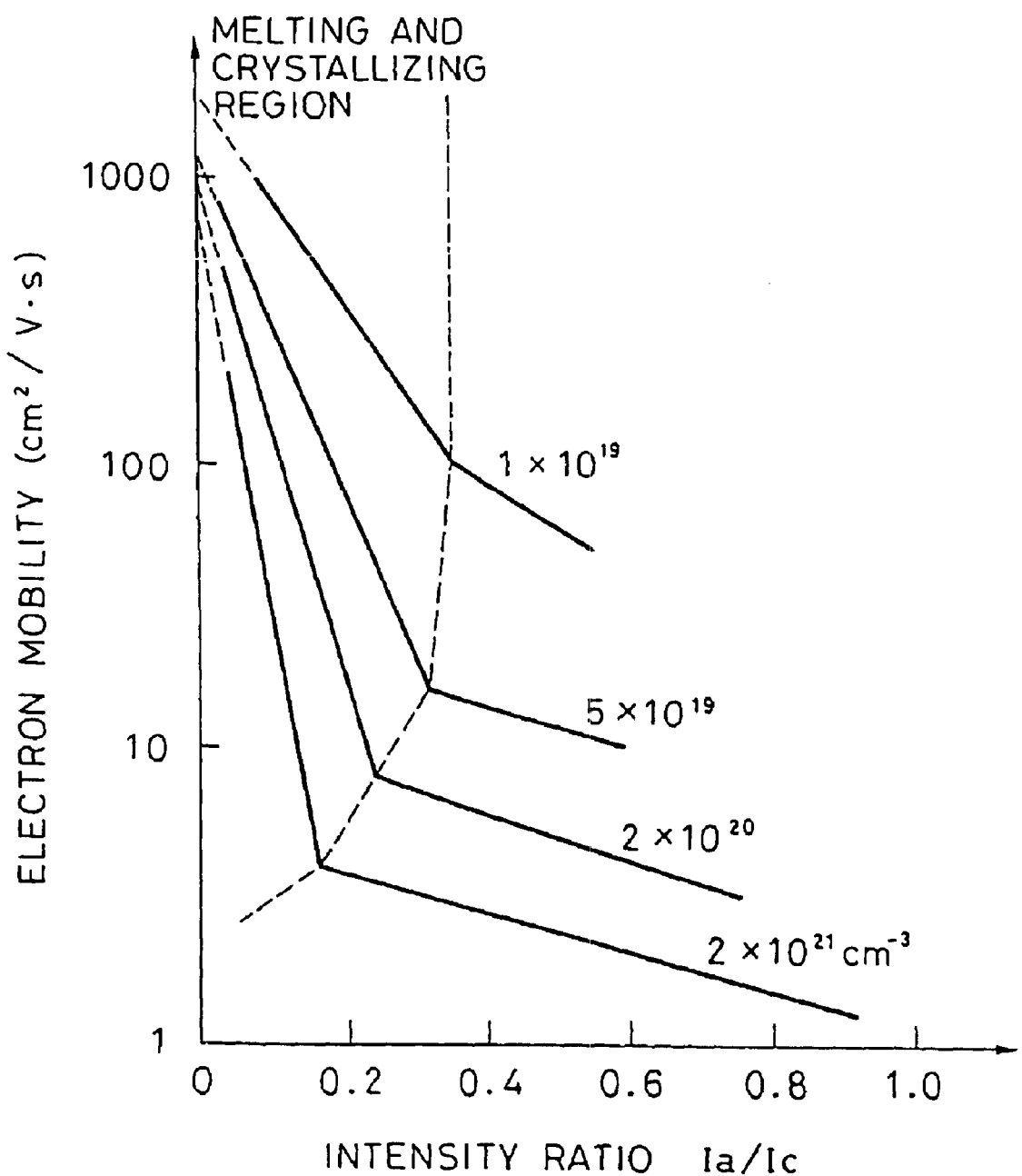
FIG. 4 is a graph showing the relation between the peak intensity ratio (Ia/Ic; taken in the abscissa) and the electron mobility (the ordinate) for laser-annealed silicon films with varying oxygen concentration, where Ia represents the Raman peak intensity (of the peak at a wavenumber of about 480 $cm^{-1}$) for the amorphous component of the laser-annealed silicon film, and Ic represents the Raman peak intensity (at about 521 $cm^{-1}$) for the single crystal silicon.

Furthermore, the present inventors found that the electron mobility can be intimately correlated with the peak intensity of a peak assigned to the amorphous component within the film. FIG. 4 is a graph showing the relation between a ratio which the present inventors define as a peak intensity ratio (Ia/Ic; taken as the abscissa), and the electron mobility for laser-annealed silicon films with varying oxygen concentration, where Ia represents the Raman peak intensity (of the peak at a wavenumber of about 480 cm$^{-1}$) for the amorphous component of the laser-annealed silicon film, and Ic represents the Raman peak intensity (at about 521 cm$^{-1}$) for the single crystal silicon. The electron mobility increased with decreasing intensity ratio, provided that the oxygen concentration is the same. This signifies that the electron mobility is higher for films containing less amorphous components. Furthermore, the electron mobility increased with decreasing oxygen concentration of the film. A similar tendency was observed on the individual effect of nitrogen and carbon concentrations. The same tendency was observed for hole mobility. The present inventors denote again this region at the left hand side of the broken lines shown in FIG. 4 as the melting and crystallizing region.

In addition, the present inventors empirically obtained higher carrier mobility with increasing intensity of Raman peaks, and the Raman peak intensity was higher for films having lower concentrations of oxygen, nitrogen, and carbon.

Conclusively, from the foregoing description, a higher carrier mobility can be obtained by decreasing the amounts of oxygen, nitrogen, and carbon incorporated into the film. More specifically, the present inventors have found that, by reducing concentration of each of the foreign atoms to $5 \times 10^{19}$ atoms·cm$^{-3}$ or lower, more preferably to $1 \times 10^{19}$ atoms·cm$^{-3}$ or lower, a high electron mobility can be obtained, said electron mobility being as high as 1000 cm$^2$/V·s for a silicon film, for example. The present inventors found that by decreasing concentrations of the foreign atoms, this high electron mobility can be ameliorated further to a value near to the carrier mobility of a single crystal semiconductor, and also that the reproducibility of this high mobility can be improved. In addition, a hole mobility of from 300 to 500 cm$^2$/V·s was obtained by a similar process.

In the present invention, the laser annealing is carried out in an atmosphere under atmospheric pressure or reduced pressure.

A laser beam or a light equivalent to the laser beam is irradiated to a noncrystal semiconductor containing therein carbon, nitrogen and oxygen at a concentration of $5 \times 10^{19}$ atoms·cm$^{-3}$ or less, preferably $1 \times 10^{19}$ atoms·cm$^{-3}$ or less, respectively.

In practice, however, it is difficult to control the concentration of the foreign atoms to a value as low as $1 \times 10^{16}$ atoms·cm$^{-3}$ and below, even if the laser annealing were to be carried out under an extremely high vacuum to a film containing the atoms at a very low concentration of $1 \times 10^{16}$ atoms·cm$^{-3}$ or lower. This is because the oxygen gas, nitrogen gas, water molecules, carbon dioxide gas, etc., which are present in the atmosphere in trace amounts are taken up in the film during the laser annealing. Otherwise, it is presumably due to the presence of a gas having adsorbed on the surface of the film, which is then trapped into the film during the laser annealing.

To circumvent the aforementioned difficulties, a particular fabrication process is requisite. One of such processes is to first cover the surface of an amorphous semiconductor containing the foreign atoms of oxygen, nitrogen, and carbon at an extremely low concentration of $10^{15}$ atoms·cm$^{-3}$ or lower with a protective film such as of silicon oxide, silicon nitride, and silicon carbide, and then laser annealing the film under a high vacuum at a pressure of $10^{-4}$ Torr or lower. Such a process enables a semiconductor film having very high mobility, with extremely low concentrations for oxygen, nitrogen, and carbon. For example, a silicon film having an electron mobility of 1000 cm$^2$/V·s was obtained with each of the concentrations of carbon, nitrogen, and carbon being controlled to $1 \times 10^{15}$ atoms·cm$^{-3}$ or lower.

The protective films, such as of silicon oxide, silicon nitride, and silicon carbide, can be favorably deposited on the surface of an amorphous semiconductor film by continuously depositing the amorphous film and the protective film in a same chamber. More specifically, a preferred process comprises, for example, depositing an amorphous semiconductor film in a chamber equipped with a single vacuum apparatus, using a chemical vapor deposition (CVD) process or a sputtering process, and then, in the same chamber, continuously depositing the protective film while maintaining the same previous atmosphere or by once evacuating the chamber to an extreme vacuum and then controlling the atmosphere to a one pertinent for the film deposition. However, to further improve the yield, the reproducibility, and the reliability of the products, it is preferred that independent chambers are provided so that the films are deposited separately therein, and that the amorphous film once deposited in a particular chamber is transferred to another chamber while maintaining the high vacuum. The selection of a particular film deposition process depends on the plant and equipment investment. At any rate, the important points to be assured are to sufficiently reduce the amount of oxygen, nitrogen, and carbon in the film and to avoid adsorption of gases on the surface of the amorphous semiconductor and at the boundary between said semiconductor and the protective film provided thereon. Even if an amorphous semiconductor film of high purity and a silicon nitride protective film thereon were to be formed, the carrier mobility would be impaired if the amorphous film were to be once exposed to the atmosphere. In general, such an amorphous film would yield a low carrier mobility even after laser annealing, and moreover, the probability to obtain a high mobility would be very low. This is believed due to the gas adsorbed on the surface of the amorphous semiconductor film which later diffuse into the film at the laser annealing process.

The protective film may be made from any material capable of transmitting a laser beam or a light equivalent to the laser beam, and usable are silicon oxide, silicon nitride, silicon carbide, and a material comprising a mixture thereof and represented by the chemical formula $SiN_xO_yC_z$ (where, $0 \leq x \leq 4/3$; $0 \leq y \leq 2$; $0 \leq z \leq 1$; and $0 \leq 3x+2y+4z \leq 4$). Preferably, the thickness of the film is in the range of from 50 to 1000 nm.

In the foregoing description, it has been shown that a semiconductor film having a high carrier mobility can be obtained by reducing the concentrations of oxygen, nitrogen, and carbon of the amorphous semiconductor film and during the laser annealing process. The electron mobility and the hole mobility obtained therefrom are mere average values of the channel-forming area in the field effect transistors fabricated for the measurement purposes; thus, those values fail to give the individual mobilities at particular minute portions within the channel-forming area. However, as was described referring to FIGS. 1 to 4 according to the present invention, it has been elucidated that the carrier mobility can be univocally defined from the parameters such as the wavenumber of the Raman peak center, the FWHM of the Raman peak, and the intensity of the Raman peak attributed to the amorphous content in contrast to that of the whole Raman peak. Thus, by the information available from Raman spectroscopy, it is possible to semi-quantitatively obtain the mobility of a minute area to which a direct measurement cannot be applied.

Figure 5:
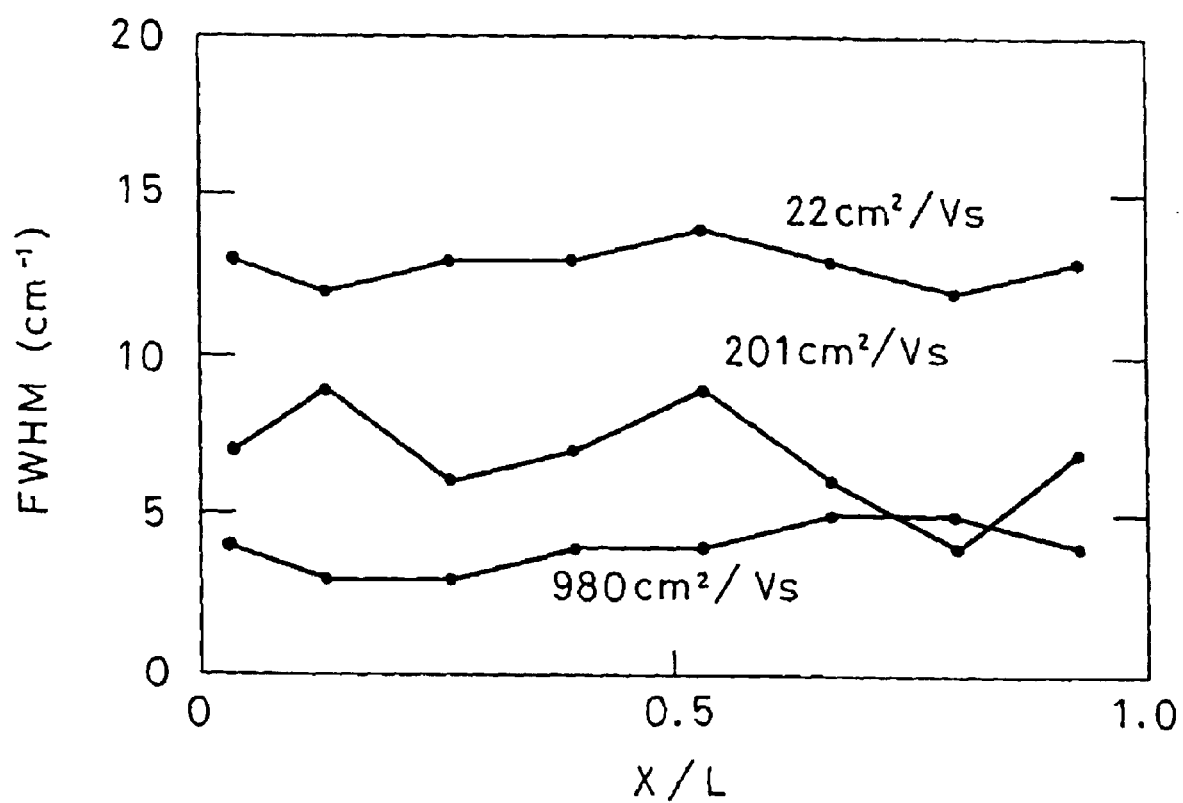
FIG. 5 is a graph showing a position-dependent change of FWHM of the Raman peak for channel-forming areas of field effect transistors, where, the abscissa is X/L with L representing the channel length, and the ordinate is FWHM.

FIG. 5 is a graph showing a position-dependent change of FWHM of the Raman peak for laser-annealed channel-forming areas of field effect transistors whose electron mobilities were found 22 cm$^2$/V·s, 201 cm$^2$/V·s, and 980 cm$^2$/V·s. Referring to FIG. 5, the abscissa is the position of the channel forming area, X/L, with L being the channel length of 100 μm, and X being the coordinate of the channel forming area. Thus, X/L=0 corresponds to the boundary between the channel-forming area and the source area, X/L=1 represents the boundary between the channel forming area and the drain area, and X/L=0.5 indicates the center of the channel-forming area.

It can be seen from FIG. 5 that the field effect transistor having an electron mobility of 22 cm$^2$/V·s has a large FWHM with little fluctuation. The data is in agreement with the previous observations of the present authors referring to FIG. 3, i.e., that the crystallinity approaches to that of a single crystal with decreasing FWHM, and that thereby the electron mobility is increased with reducing FWHM. These data show, in addition, that the positional variation in FWHM (dependence of FWHM on position) is low and hence a uniform crystallinity is obtained over the whole film. The film yielded an oxygen concentration of about 8×10$^{20}$ atoms·cm$^{-3}$, and it is assumed that it had not undergone melting during laser annealing.

The channel-forming area of a field effect transistor having an electron mobility of 201 cm$^2$/V·s also yielded an oxygen concentration of 8×10$^{20}$ atoms·cm$^{-3}$. As shown in FIG. 5, the FWHM is lowered over the whole area, and is largely dependent on the position. Moreover, some points yielded FWHM values comparable to, or even lower than those of the channel-forming area having an electron mobility of 980 cm$^2$/V·s. A low FWHM is suggestive of a high electron mobility at that point, and that a localized portion having a high crystallinity equal to that of a single crystal silicon is present. From the viewpoint of mass-production of devices, such a material having large local fluctuations is not favorable despite a high mobility.

The channel-forming area of a field effect transistor having an electron mobility of 980 cm$^2$/V·s yielded an oxygen concentration of about 1×10$^{19}$ atoms·cm$^{-3}$, which was considerably lower than those of two above. From FIG. 5 it can be seen that the FWHM is generally low and has less positional dependence. The graph indicates that the material has a high electron mobility as a whole, and that it is composed of a material having a crystallinity well comparable to that of a single crystal silicon. Thus, such a material is suitable for mass production to be used in devices.

To achieve a high carrier mobility, not only the concentration of the foreign atoms should be lowered, but also the conditions for the laser annealing must be optimized. The conditions for the laser annealing vary depending on the operating conditions of the laser (such as whether the laser is operated in a continuous mode or in a pulsed mode, the repetition cycle, beam intensity, and wavelength), and the coating. The lasers to be used in the process is selected from ultraviolet(UV)-emitting lasers such as the various types of excimer lasers, and lasers emitting light in the visible and infrared (IR) regions, such as a YAG laser. A suitable laser should be selected depending on the thickness of the film to be laser-annealed. In silicon and germanium materials, the laser annealing is effected at relatively shallow portions on the surface when a UV-emitting laser is used, because the materials have a short absorption length for UV light. On the other hand, because those materials have a longer absorption length for a light in the visible and IR regions, such a beam penetrate deep into the material to effect laser annealing of the inner portions. Thus, it is possible to obtain a laser-annealed portion only at the vicinity of the film surface by properly selecting the thickness of the coating and the type of the laser. Anyway, a high carrier mobility can be obtained by optimally controlling the laser conditions such as wavelength and intensity, so that melting and recrystallization may occur on the film. To sufficiently effect melting of the film, the laser-irradiated portion should be maintained at a temperature not lower than the melting point of the semiconductor under process for a long duration. In the case of melting silicon, for example, it requires heating to 1400° C. or higher under the atmospheric pressure; in germanium, it should be heated to at least 1000° C. under the atmospheric pressure to effect the melting. However, in an extremely short period of, for example, 10 nsec as practiced in excimer lasers, a temperature as high as 2000° C. or even higher is achieved instantaneously and spectroscopically observed. Such a high temperature does not always cause melting of the film. Thus, a definition of a temperature in this case does not make sense.

In addition, a further annealing of a laser-annealed semiconductor film in hydrogen gas atmosphere in the temperature range of from 200 to 600° C. for a duration of from 10 minutes to 6 hours was effective to obtain a high carrier mobility at an improved reproducibility. This is presumably due to the formation of many dangling bonds at the interatomic bonding sites within the semiconductor during the laser annealing, which is effected simultaneously with the crystallization. Such dangling bonds then function as barriers to the carriers. If a considerable amount of oxygen, nitrogen, and carbon atoms were to be incorporated in the semiconductor, those foreign atoms may enter into the interstices of such dangling bonds; however, when the concentrations of oxygen, nitrogen, and carbon are extremely low as in the present case, the dangling bonds remain as they are and therefore require a further annealing in hydrogen atmosphere after the laser annealing.

The present invention is described in further detail below referring to non-limiting examples.

EXAMPLE 1

Figure 6:
FIG. 6 shows a process for fabricating a field effect transistor.
Figure 6:
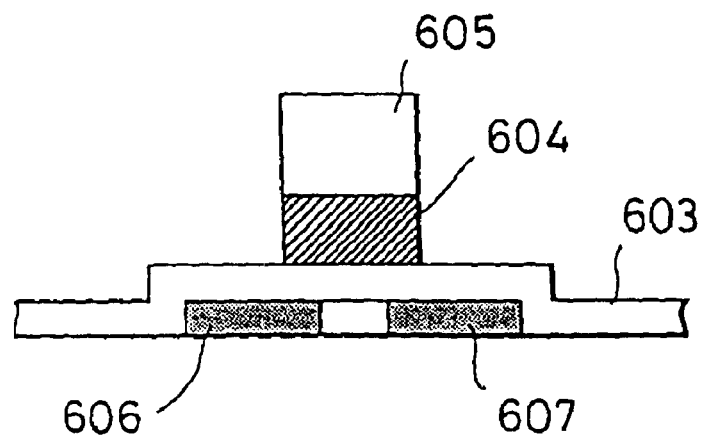
Figure 6:
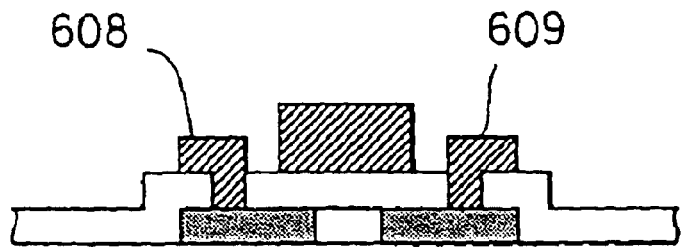

A planar TFT was fabricated and the electric characteristics thereof were evaluated. Referring to FIG. 6, the process for the fabrication thereof is described. First, an amorphous silicon film (an activation layer of the TFT) was deposited on a quartz substrate 601 at a thickness of about 100 nm by a conventional RF sputtering process, at a substrate temperature of 150° C. under an atmosphere consisting substantially of 100% argon at a pressure of 0.5 Pa. A 99.99% or higher purity argon gas was used alone, without adding other gases such as hydrogen. The sputtering was conducted at a power input of 200 W and an RF frequency of 13.56 MHz. The resulting film was etched into a 100 μm×500 μm rectangle to obtain a desired amorphous silicon film 602.

The film was confirmed by secondary ion mass spectroscopy (SIMS) to contain each of oxygen, nitrogen, and carbon at a concentration of 10$^{19}$ atoms·cm$^{-3}$ or less.

The film was then placed in a vacuum vessel controlled to a vacuum of 10$^5$ Torr for laser annealing. A KrF excimer laser was operated at a pulse duration of 10 nsec, an irradiation energy of 200 mJ, and a pulse repetition of 50 shots, to effect laser annealing by irradiating a laser beam at a wavelength of 248 nm to the film.

A gate dielectric 603 was then deposited by sputtering on the surface of the thus obtained laser-annealed silicon film in an oxygen atmosphere, at a thickness of about 100 nm. The film-deposition was conducted at a substrate temperature of 150° C. and at an RF (13.5 MHz) power input of 400 W. The atmosphere was controlled to be substantially oxygen, and no other gas was intentionally added. The oxygen gas was of 99.9% or higher purity, and the pressure thereof was 0.5 Pa.

Then, a 200 nm thick aluminum film was deposited by a known vacuum deposition process, and was further subjected to a conventional dry etching process to remove the unnecessary portions to obtain a 100$\mu$m wide gate 604. At this point, a photoresist 605 used in the dry etching process was left unremoved on the gate.

Boron ions were then doped to the whole structure other than the gate by ion implantation at a dopant concentration of $10^{14}$ cm$^{-2}$. In this case, the gate and the photoresist thereon were utilized as masks to avoid doping of boron ions to the portion under the gate. Thus were obtained impurity areas, i.e., a source area 606 and a drain area 607. The resulting structure is given in FIG. 6(B).

The resulting structure was then placed in a vacuum vessel controlled to a vacuum of $10^{-5}$ Torr for laser annealing. A KrF excimer laser was operated at a pulse duration of 10 nsec, an irradiation energy of 100 mJ, and a pulse repetition of 50 shots, to effect the film annealing by irradiating a beam at a wavelength of 248 nm. The impurity areas which were made amorphous by the ion doping were thus recrystallized.

The laser-annealed structure was thermally annealed further in hydrogen atmosphere. The substrate was placed in a chamber equipped with a vacuum-evacuating means. The chamber was first evacuated to a vacuum of $10^{-6}$ Torr using a turbo molecular pump, and this state was maintained for 30 minutes. Then a 99.99% or higher purity hydrogen gas was introduced to the chamber until the pressure was recovered to 100 Torr, to anneal the substrate at 300° C. for 60 minutes. The vessel was once evacuated to remove the adhered gases, water, and the like from the film, because it had been known empirically that a high mobility with favorable reproducibility cannot be obtained for the films having thermally annealed with those impurities being adhered thereto.

Finally, a 100 nm thick silicon oxide film provided on the top of the source and the drain areas was perforated to form thereon aluminum contacts 608 and 609. Thus was a complete field effect transistor obtained. A channel is located in the activation layer under the gate electrode between the source and the drain areas in the field effect transistor and comprises the intrinsic or substantially intrinsic semiconductor crystallized by the KrF excimer laser.

The measurement of C-V characteristics on this field effect transistor yielded an electron mobility of 980 cm$^2$/V·s for the channel forming area. The threshold voltage was 4.9 V. The concentrations of oxygen, nitrogen, and carbon of this field effect transistor were each found by SIMS to be $1 \times 10^{19}$ atoms·cm$^{-3}$ or lower.

EXAMPLE 2

A planar TFT was fabricated and the electric characteristics thereof were evaluated. First, an amorphous silicon film containing phosphorus at a concentration of $3 \times 10^{17}$ atoms·cm$^{-3}$ was deposited on a quartz substrate at a thickness of about 100 nm by a conventional RF sputtering process. The amorphous silicon film having deposited at this thickness can be wholly annealed by a KrF laser beam at a wavelength of 248 nm. The RF sputtering was performed at a substrate temperature of 150° C. under an atmosphere consisting substantially of 100% argon at a pressure of 0.5 Pa. A 99.99% or higher purity argon gas was used alone, without adding other gases such as hydrogen. The sputtering was conducted at a power input of 200 W and an RF frequency of 13.56 MHz. The resulting film was etched into a 100$\mu$m×500$\mu$m rectangle to obtain the desired amorphous silicon film.

The film was confirmed by secondary ion mass spectroscopy (SIMS) to contain each of oxygen, nitrogen, and carbon at a concentration of $10^{19}$ atoms·cm$^{-3}$ or less.

A gate dielectric was then deposited by sputtering on the surface of the thus obtained silicon film in an oxygen atmosphere, at a thickness of about 100 nm. The film-deposition was conducted at a substrate temperature of 150° C. and at an RF (13.56 MHz) power input of 400 W. The atmosphere was controlled to be substantially oxygen, and no other gas was intentionally added. The oxygen gas was of 99.9% or higher purity, and the pressure thereof was 0.5 Pa.

Then, a 200 nm thick aluminum film was deposited by a known vacuum deposition process, and was further subjected to a conventional dry etching process to remove the unnecessary portions to obtain a gate at a width of 100$\mu$m. At this point, a photoresist used in the dry etching process was left on the gate.

Boron ions were then doped to the whole structure except for the gate by ion implantation at a dopant concentration of $10^{14}$ cm$^{-2}$. In this case, the gate and the photoresist thereon were utilized as masks to avoid doping of boron ions to the portion under the gate. Thus were obtained impurity areas, i.e., a source area and a drain area, in the silicon film.

The resulting structure was then placed in a vacuum vessel controlled to a vacuum of $10^{-5}$ Torr for laser annealing. A KrF excimer laser was operated at a pulse duration of 10 nsec, an irradiation energy of 100 mJ, and a pulse repetition of 50 shots, to anneal the film by irradiating a beam at a wavelength of 248 nm from the back of the substrate. Thus was the amorphous silicon film recrystallized. In this process, the crystallization of the source or the drain area can be effected simultaneously with the crystallization of the channel forming area. The instant process is therefore advantageous in that a favorable boundary with a continuous crystallinity can be obtained with less defects, as compared with the process of EXAMPLE 1 in which many defects were found to generate in the boundary between the source or drain area and the channel forming area.

The laser-annealed structure was thermally annealed further in hydrogen atmosphere. The substrate was placed in a chamber equipped with a vacuum-evacuating means. The chamber was first evacuated to a vacuum of $10^{-6}$ Torr using a turbo molecular pump, and then heated to 100° C. to maintain this state for 30 minutes. Then a 99.99% or higher purity hydrogen gas was introduced to the chamber until the pressure was recovered to 100 Torr, so that annealing of the substrate may be conducted then at 300° C. for 60 minutes. The vessel was once evacuated to remove the adhered gases, water, and the like from the film, because it had been known empirically that a high mobility with favorable reproducibility cannot be obtained for the films having thermally annealed with those impurities being adhered thereto.

Finally, a 100 nm thick silicon oxide film provided on the top of the source and the drain areas was perforated to form thereon aluminum contacts. Thus was the structure completed into a field effect transistor.

The measurement of C-V characteristics on this field effect transistor yielded an electron mobility of 990 cm$^2$/V·s for the channel forming area. The threshold voltage was 3.9 V. The present field effect transistor yielded an improved (lower) threshold voltage as compared with that of the field effect transistor fabricated in EXAMPLE 1. This is assumed attributable to the simultaneous laser annealing of the impurity areas and the channel forming area, which might have crystallized uniformly at the same time by irradiating the laser beam from the back. Furthermore, the drain current ratio at the ON/OFF of the gate voltage was found to be $5 \times 10^6$.

The concentrations of oxygen, nitrogen, and carbon of this field effect transistor were each found by SIMS to be $1 \times 10^{19}$ atoms·cm$^{-3}$ or lower. The Raman spectroscopy of the channel forming area resolved a Raman peak at a center wavenumber of 520 cm$^{-1}$, having a FWHM of 4.5 cm$^{-1}$. The presence of a once melted and recrystallized silicon was evidenced by those results.

EXAMPLE 3

A planar TFT was fabricated and the electric characteristics thereof were evaluated. First, about 100 nm thick amorphous silicon film and a 10 nm thick silicon nitride coating thereon were continuously deposited on a quartz substrate having coated with a 10 nm thick silicon nitride coating by using a film-deposition apparatus having two chambers. The amorphous silicon film was deposited by a conventional sputtering method, and the silicon nitride film was deposited by a glow-discharge plasma chemical vapor deposition (CVD).

The substrate was set in a first pre-chamber which was heated to 200° C. and evacuated to a pressure of $10^{-6}$ Torr or lower for 1 hour. Separately, an air-tight first chamber, which is constantly controlled to a pressure of $10^{-4}$ Torr or lower except for the case of film deposition, was evacuated to $10^{-6}$ Torr. The substrate was transferred from the first pre-chamber to the first chamber and set therein, at which point the chamber was evacuated to $10^{-6}$ Torr or lower while maintaining the substrate and the target to a temperature of 200° C. for a duration of 1 hour. Then, argon gas was introduced into the chamber to generate an RF plasma to conduct film deposition by sputtering. A 99.9999% or higher purity silicon target containing 1 ppm of phosphorus was used for the target. The film deposition was conducted with the substrate temperature being maintained at 150° C., in an atmosphere consisting substantially of 100% argon gas at a pressure of $5 \times 10^{-2}$ Torr. No gases other than argon, such as hydrogen, was added intentionally. The argon gas used herein was of 99.9999% or higher purity. The sputtering was operated at an input power of 200 W and an RF frequency of 13.56 MHz.

Upon completion of the film deposition, the RF discharge was cut off, and while evacuating the first chamber to a vacuum of $10^{-6}$ Torr, an air-tight second pre-chamber, which is provided between the first and second chambers and is constantly maintained to a pressure of $10^{-5}$ Torr or lower, was vacuum-evacuated to $10^{-6}$ Torr, so that the substrate may be transferred therein from the first chamber. Then, an air-tight second chamber, which is always maintained at a pressure of b $10^{-4}$ Torr or lower except for the case of carrying out a film deposition, was evacuated to $10^{-6}$ Torr to set therein the substrate having transferred from the second pre-chamber. The substrate was kept at 200° C. in the second chamber, while the chamber was evacuated to maintain the substrate under a pressure of $10^{-6}$ Torr or lower for 1 hour.

Then, a gas mixture diluted with hydrogen and comprising a 99.9999% or higher purity ammonia gas and disilane (Si$_2$H$_6$) gas at a ratio of 3:2 was introduced in the second chamber to control the overall pressure to $10^{-1}$ Torr. An RF current was applied to the chamber to generate a plasma therein, so that a silicon nitride film might be deposited on the substrate. The power input was 200 W, at a frequency of 13.56 MHz.

After completion of the film deposition, the RF discharge was cut off. While evacuating the second chamber to $10^{-6}$ Torr, a third pre-chamber, which is provided at one side of the second chamber and having a quartz window, was vacuum evacuated to $10^{-6}$ Torr, at which point the substrate was transferred from the second chamber to the third pre-chamber. Then, a KrF excimer laser was operated at a pulse duration of 10 nsec, an irradiation energy of 100 mJ, and a pulse repetition of 50 shots, so that a laser beam at a wavelength of 248 nm was irradiated to the film to effect the laser annealing. Thus was the amorphous silicon film crystallized.

The process described in the foregoing was particularly effective for improving the product yield. By thus conducting continuously the laser annealing from the point of film deposition without substantially disturbing the vacuum state, a high product yield can be achieved irrespective of the presence of a protective film on the amorphous film. Accordingly, the process is effective on the FETs described in EXAMPLES 1 and 2 as well, in which no protective films are provided. Assumably, the films are maintained free from adhesion of dusts, etc., from adsorption of water and gases, and from scratches and other defects.

The process of continuously conducting the film deposition and the annealing thereof as described above, may be carried out in two ways. One is establishing a film-deposition chamber and separately a pre-chamber as described in the foregoing, and providing a window in the pre-chamber to effect the laser annealing through this window. The other process is similar to the first, except that the window is provided to the film-deposition chamber so that the laser annealing may be effected subsequently to the film deposition. The latter process, however, requires etching of the window to remove the coating having adhered during the film-deposition process, since the coating adhesions make the window translucent. Accordingly, the former process is favorable from the viewpoint of its applicability to mass production and the maintenance costs.

After the laser annealing is finished in the third pre-chamber, a dry nitrogen gas is introduced into the third pre-chamber to recover the atmospheric pressure. The substrate was then taken out from the third pre-chamber, and the silicon nitride film having deposited thereon was removed by a known dry etching process. The resulting silicon film was etched into a 100 μm×500μm rectangular shape.

The concentrations of oxygen, nitrogen, and carbon of this field effect transistor were each $1 \times 10^{16}$ atoms·cm$^{-3}$ or lower, which were each confirmed by SIMS performed on a separate film fabricated by the same process.

A gate dielectric was then deposited on the surface of the thus obtained laser-annealed silicon film in an oxygen atmosphere by sputtering, at a thickness of about 100 nm. The film-deposition was conducted at a substrate temperature of 150° C. and at an RF (13.56 MHz) power input of 400 W. A 99.9999% or higher purity silicon oxide was used as the target for sputtering. The atmosphere was controlled to be substantially oxygen, and no other gas was intentionally added. The oxygen gas was of 99.999% or higher purity, and the pressure thereof was $5 \times 10^{-2}$ Torr.

Then, a 200 nm thick aluminum film was deposited by a known vacuum deposition process, and was further subjected to a conventional dry etching process to remove the unnecessary portions to obtain a gate at a width of 100μm. At this point, a photoresist used in the dry etching process was left on the gate.

Boron ions were then doped to the whole structure except for the gate by ion implantation at a dopant concentration of $10^{14}$ cm$^{-2}$. In this case, the gate and the photoresist thereon were utilized as masks to avoid doping of boron ions to the portion under the gate. Thus were obtained impurity areas, i.e., a source area and a drain area, in the silicon film.

The resulting structure was then placed in a vacuum vessel controlled to a vacuum of $10^{-5}$ Torr for laser annealing. A KrF excimer laser was operated at a pulse duration of 10 nsec, an irradiation energy of 50 mJ, and a pulse repetition of 50 shots, to anneal the film by irradiating a beam at a wavelength of 248 nm from the back of the substrate. Thus, the impurity areas which were made amorphous by the ion doping were recrystallized, that is, the amorphous silicon in the impurity areas was recrystallized.

The present process is similar to that described in EXAMPLE 1 in the point that the laser annealing is conducted in two steps, however, the present process should be distinguished from the previous in that the laser annealing is effected by irradiating the beam from the back of the substrate to form a continuous junction between the impurity regions and the channel forming area. In particular, the first laser annealing is conducted for the purpose of producing a film of high carrier mobility by effecting melting-recrystallization, whereas the second laser annealing is conducted at a lower laser output to accelerate ordering in the microscopic level while avoiding melting of the film, and to thereby reduce the resistance in the impurity area. Since the laser output is controlled to a lower level, the crystalline area (mainly the channel forming area) having established in the first laser annealing remain unaffected in the second laser annealing. Furthermore, as was described in EXAMPLE 2, a boundary having continuous crystallinity reduced in defects can be obtained between the source or drain area and the channel forming area.

Laser annealing by irradiation of an ultraviolet laser beam from the substrate surface is effective for the surface portion to which the ultraviolet laser beam is irradiated, and is not sufficiently effective for deeper portion, that is, there is a high possibility that a high mobility cannot be obtained in the deeper portion. Thereby production yield may be lowered. Laser irradiation from the back of the substrate is not sufficiently effective for obtaining a high mobility in a portion of the activation layer in contact with the gate electrode. Therefore, laser annealing is carried out twice in this embodiment, that is, the first laser annealing is carried out by irradiating a laser beam to the amorphous silicon film from the surface side thereof and the second laser annealing is carried out by irradiating a laser beam to the film from the back of the substrate, to increase the production yield and to establish a continuous junction between the channel forming area and the impurity areas.

The laser-annealed structure was thermally annealed further in hydrogen atmosphere. The substrate was placed in a chamber equipped with a vacuum-evacuating means. The chamber was first evacuated to a vacuum of $10^{-6}$ Torr using a turbo molecular pump, and then heated to 100° C. to maintain this state for 30 minutes. Then a 99.99% or higher purity hydrogen gas was introduced to the chamber until the pressure was recovered to 100 Torr, so that annealing of the substrate may be conducted then at 300° C. for 60 minutes. The vessel was once evacuated to remove the adhered gases, water, and the like from the film, because it had been known empirically that a high mobility with favorable reproducibility cannot be obtained for the films having thermally annealed with those impurities being adhered thereto.

Finally, a 100 nm thick silicon oxide film provided on the top of the source and the drain areas was perforated to form thereon aluminum contacts. Thus was the structure completed into a field effect transistor.

One hundred field effect transistors above were fabricated. The measurement of C-V characteristics on these field effect transistors yielded an average electron mobility of 995 cm$^2$/V·s for the channel forming area. The threshold voltage was 4.2 V in average. The drain current ratio at the ON/OFF of the gate voltage was found to be $8\times10^6$ in average. Each of the field effect transistors thus fabricated was checked whether it had favorable characteristics on electron mobility, threshold voltage, and drain current ratio. The standard values for the electron mobility, the threshold voltage, and the drain current ratio were set to 800 cm$^2$/V·s, 5.0 V, and $1\times10^6$, respectively. Ninety-one out of 100 field effect transistors were found as being favorable.

The concentrations of oxygen, nitrogen, and carbon of these field effect transistors evaluated as favorable were each found by SIMS to be $1\times10^{16}$ atoms·cm$^{-3}$ or lower.

As described in the foregoing, the present invention provides thin film semiconductors of high mobility at an excellent reproducibility. The description above was made mainly on the laser annealing of a semiconductor film having deposited on an insulator substrate made of quartz and the like, however, the present invention is not only limited thereto and can be applied to single crystal semiconductors such as single crystal silicon substrate which are used in, for example, monolithic integrated circuits (ICs). Furthermore, in addition to the silicon film which was described in great detail in the EXAMPLES, the present invention can be applied to a germanium film, silicon-germanium alloy films, or films of various other intrinsic semiconductor materials as well as compound semiconductor materials. As described hereinbefore, it should be further noted that the term "laser annealing", which is used as a means of increasing the mobility of an amorphous film, refers inclusively to means in which a high density optical energy is used, such as a flash lamp annealing. Thus, it should be noted that a process using a high density optical energy for improving the crystallinity of a semiconductor material is within the scope of the present invention.

While the invention has been described in detail and with reference to specific embodiments thereof, it will be apparent to one skilled in the art that various changes and modifications can be made therein without departing from the spirit and scope thereof.

What is claimed is:

1. A method for manufacturing a semiconductor device comprising the steps of:

forming a semiconductor film over a substrate, said semiconductor film containing carbon at a concentration of $5\times10^{19}$ atoms/cm$^3$ or less; and melting said semiconductor film by irradiating a CW laser light to crystallize said semiconductor film.

2. A method for manufacturing a semiconductor device comprising the steps of:

forming a semiconductor film over a substrate, said semiconductor film containing oxygen at a concentration of $5\times10^{19}$ atoms/cm$^3$ or less; and melting said semiconductor film by irradiating a CW laser light to crystallize said semiconductor film.

3. A method for manufacturing a semiconductor device comprising the steps of:
   forming a semiconductor film over a substrate, said semiconductor film containing nitrogen at a concentration of $5 \times 10^{19}$ atoms/cm$^3$ or less; and
   melting said semiconductor film by irradiating a CW laser light to crystallize said semiconductor film.

4. A method for manufacturing a semiconductor device comprising the steps of:
   forming a semiconductor film over a substrate, said semiconductor film containing carbon at a concentration of $5 \times 10^{19}$ atoms/cm$^3$ or less;
   forming a protective layer on said semiconductor film; and
   melting said semiconductor film by irradiating a CW laser light though said protective film to crystallize said semiconductor film.

5. A method for manufacturing a semiconductor device comprising the steps of:
   forming a semiconductor film over a substrate, said semiconductor film containing oxygen at a concentration of $5 \times 10^{19}$ atoms/cm$^3$ or less;
   forming a protective layer on said semiconductor film; and
   melting said semiconductor film by irradiating a CW laser light though said protective film to crystallize said semiconductor film.

6. A method for manufacturing a semiconductor device comprising the steps of:
   forming a semiconductor film over a substrate, said semiconductor film containing nitrogen at a concentration of $5 \times 10^{19}$ atoms/cm$^3$ or less;
   forming a protective layer on said semiconductor film; and
   melting said semiconductor film by irradiating a CW laser light though said protective film to crystallize said semiconductor film.

7. A method for manufacturing a semiconductor device comprising the steps of:
   forming a semiconductor film over a substrate, said semiconductor film containing carbon at a concentration of $5 \times 10^{19}$ atoms/cm$^3$ or less;
   melting said semiconductor film by irradiating a CW laser light to crystallize said semiconductor film; and
   annealing the crystallized semiconductor film in an atmosphere containing hydrogen.

8. A method for manufacturing a semiconductor device comprising the steps of:
   forming a semiconductor film over a substrate, said semiconductor film containing oxygen at a concentration of $5 \times 10^{19}$ atoms/cm$^3$ or less;
   melting said semiconductor film by irradiating a CW laser light to crystallize said semiconductor film; and
   annealing the crystallized semiconductor film in an atmosphere containing hydrogen.

9. A method for manufacturing a semiconductor device comprising the steps of:
   forming a semiconductor film over a substrate, said semiconductor film containing nitrogen at a concentration of $5 \times 10^{19}$ atoms/cm$^3$ or less;
   melting said semiconductor film by irradiating a CW laser light to crystallize said semiconductor film; and
   annealing the crystallized semiconductor film in an atmosphere containing hydrogen.

10. A method for manufacturing a semiconductor device comprising the steps of:
    forming a semiconductor film over a substrate, said semiconductor film containing carbon at a concentration of $5 \times 10^{19}$ atoms/cm$^3$ or less;
    patterning said semiconductor film to form a semiconductor island;
    melting said semiconductor island by irradiating a CW laser light to crystallize said semiconductor island;
    forming a gate insulating film over the crystallized semiconductor island; and
    forming a gate electrode over said gate insulating film.

11. A method for manufacturing a semiconductor device comprising the steps of:
    forming a semiconductor film over a substrate, said semiconductor film containing oxygen at a concentration of $5 \times 10^{19}$ atoms/cm$^3$ or less;
    patterning said semiconductor film to form a semiconductor island;
    melting said semiconductor island by irradiating a CW laser light to crystallize said semiconductor island;
    forming a gate insulating film over the crystallized semiconductor island; and
    forming a gate electrode over said gate insulating film.

12. A method for manufacturing a semiconductor device comprising the steps of:
    forming a semiconductor film over a substrate, said semiconductor film containing nitrogen at a concentration of $5 \times 10^{19}$ atoms/cm$^3$ or less;
    patterning said semiconductor film to form a semiconductor island;
    melting said semiconductor island by irradiating a CW laser light to crystallize said semiconductor island;
    forming a gate insulating film over the crystallized semiconductor island; and
    forming a gate electrode over said gate insulating film.

13. A method for manufacturing a semiconductor device comprising the steps of:
    forming a semiconductor film over a substrate, said semiconductor film containing carbon at a concentration of $5 \times 10^{19}$ atoms/cm$^3$ or less; and
    melting said semiconductor film by irradiating a CW laser light to crystallize said semiconductor film in vacuum.

14. A method for manufacturing a semiconductor device comprising the steps of:
    forming a semiconductor film over a substrate, said semiconductor film containing oxygen at a concentration of $5 \times 10^{19}$ atoms/cm$^3$ or less; and
    melting said semiconductor film by irradiating a CW laser light to crystallize said semiconductor film in vacuum.

15. A method for manufacturing a semiconductor device comprising the steps of:
    forming a semiconductor film over a substrate, said semiconductor film containing nitrogen at a concentration of $5 \times 10^{19}$ atoms/cm$^3$ or less; and
    melting said semiconductor film by irradiating a CW laser light to crystallize said semiconductor film in vacuum.

16. A method according to any one of claims 1 to 15, wherein said CW laser light is a YAG laser light.

17. A method according to any one of claims 1 to 15, wherein said semiconductor film comprises silicon or silicon-germanium alloy.

18. A method according to any one of claims 4 to 6, wherein said protective layer comprises a material expressed by a formula $SiN_xO_yC_z$, where $0 \leq x \leq 4/3$, $0 \leq y \leq 2$, $0 \leq z \leq 1$, and $0 < 3x+2y+4Z \leq 4$.

* * * * *